United States Patent
Tonti et al.

(10) Patent No.: US 6,522,152 B1
(45) Date of Patent: Feb. 18, 2003

(54) METHOD AND APPARATUS FOR ADAPTIVE CANCELLATION OF RESPONSES IN CABLING

(75) Inventors: James G. Tonti, Valkaria, FL (US); James A. Patterson, Tempe, AZ (US); James R. Sciacero, Scottsdale, AZ (US)

(73) Assignee: Microtest Inc., Phoenix, AZ (US)

( * ) Notice: Subject to any disclaimer, the term of this patent is extended or adjusted under 35 U.S.C. 154(b) by 20 days.

(21) Appl. No.: 09/713,383

(22) Filed: Nov. 15, 2000

Related U.S. Application Data

(63) Continuation of application No. 09/569,005, filed on May 11, 2000.
(60) Provisional application No. 60/172,448, filed on Dec. 17, 1999, and provisional application No. 60/133,932, filed on May 13, 1999.

(51) Int. Cl.[7] .............................................. G01R 27/04
(52) U.S. Cl. ....................................... 324/628; 324/543
(58) Field of Search ................................ 324/628, 535, 324/543, 617, 539

(56) References Cited

U.S. PATENT DOCUMENTS

| | | |
|---|---|---|
| 5,251,151 A | 10/1993 | Demjanenko et al. |
| 5,517,537 A | 5/1996 | Greene et al. |
| 5,524,281 A | 6/1996 | Bradley et al. |
| 5,532,603 A | 7/1996 | Bottman |
| 5,576,480 A | 11/1996 | Hopkins et al. |
| 5,608,657 A | 3/1997 | Conway et al. |
| 5,650,728 A | 7/1997 | Rhein et al. |
| 5,661,615 A | 8/1997 | Waugh et al. |
| 5,673,108 A | 9/1997 | Takeuchi |
| 5,680,025 A | 10/1997 | Bowers, III et al. |
| 5,698,985 A | 12/1997 | Bottman |
| 5,768,148 A | 6/1998 | Murphy et al. |
| 5,862,391 A | 1/1999 | Salas et al. |
| 5,895,141 A | 4/1999 | Budnik et al. |

*Primary Examiner*—N. Le
*Assistant Examiner*—Vincent Q. Nguyen
(74) *Attorney, Agent, or Firm*—Snell & Wilmer LLP

(57) ABSTRACT

An Adaptive Vector Cancellation method which uses time domain data for an instrument connection to estimate magnitude, phase, and time position of a signal response such as NEXT or Return Loss associated with the connection. Based on the estimate of the amplitude and time of the connection response, a suitable full-bandwidth frequency response that corresponds to a point source of NEXT or Return Loss is determined. This calculated connector response is then scaled to an appropriate magnitude, phase and time shifted to the estimated position of the actual connection. The scaled/shifted response is then vectorially combined with the measured sweep data to suitably cancel the connection contribution to NEXT and/or Return Loss. Thus, the amount of NEXT or return loss existing in the user's patch cord is preserved, while the NEXT or return loss due to the instrument connection is suitably suppressed. Correction is done in the frequency domain, over the full bandwidth of the measured data.

22 Claims, 11 Drawing Sheets

V(f) >> Inverse Fourier Transform >> v(t)

METHOD AND APPARATUS FOR ADAPTIVE CANCELLATION OF RESPONSES IN CABLING

CROSS-REFERENCE TO RELATED APPLICATIONS

This application claims the benefit of U.S. Provisional Application Ser. No. 60/172,448, filed Dec. 17, 1999 and is a continuation of U.S. patent application Ser. No. 09/569,005, filed May 11, 2000 which claims the benefit of U.S. Provisional Application Ser. No. 60/133,932 filed May 13, 1999.

BACKGROUND OF INVENTION

1. Technical Field

This invention relates generally to the use of signal processing techniques for determining the transmission performance data of cabling systems, and more particularly, to techniques for canceling undesired signals in cabling systems.

2. Background of the Invention

The transmission performance characteristics of modern high speed data communication twisted pair cabling systems are defined by various international and industry working bodies (standards organizations) to assure standard data communication protocols can successfully be transmitted through the transmission media. These data communication cabling systems (known as channels) typically consist of connectors (modular 8 plugs and jacks) and one or more forms of twisted pair cabling. The requirements for important RF transmission performance parameters such as Near End Crosstalk (NEXT), Return Loss, Insertion Loss, and Equal Level Far End Crosstalk (ELFEXT) are typically specified as a function of frequency. To assure compliance of cabling systems with these requirements, field test instruments are available to certify that installed cabling meets the frequency domain requirements. These instruments perform certain measurements to verify compliance with the standards and provide an overall Pass or Fail indication.

A typical channel 100 in a structured cabling system and the associated field test configuration is shown in FIG. 1. The channel 100 consists of a user's patch cord 102 (typically connecting a network hub to a patch panel), a data communication patch panel 104 (generally located in a wiring closet), a length of cable 106, data connectors 108a,b, and another patch cord 110 between connector 108 and a user's computer/workstation (not shown).

Field testing of the channel transmission performance is typically done with field test equipment that runs a full suite of frequency domain tests from both ends of the channel. The field test equipment is typically interfaced through a "channel adapter" containing a modular-8 jack to connect to the user's patch cords on both ends of the channel. Tests of Near-End Crosstalk (NEXT), Return Loss, Insertion Loss (Attenuation), and ELFEXT (Equal-Level Far-End Crosstalk) are the typical measurements performed by these instruments to certify transmission parameters. The measurements are then compared to a set of limit criteria as defined by the specific category of performance and a Pass/Fail indication is made.

An example of a NEXT measurement for a high performance Category 6 channel is shown in FIG. 2. If the NEXT value exceeds the limit, then it is considered to have failed, and its data transmission capability is questionable. Field testers perform similar tests for the other transmission parameters of a channel to qualify the channel for use.

One field test problem arises from the definition of the components of the cabling that are to be included in the channel field test measurements. Referring back to FIG. 1, channel 100 is defined as "near" user patch cord 102, a pair of connections 114, 116, the length of "horizontal" cable 106, and "far" end user patch cord 110. However, this channel definition does not include first and last connections 108a,b where field tester 118 (and ultimately computer network equipment) are interfaced. The excluded components include the modular jack on the test equipment and the modular plug that is on the end of the user patch cord. This definition may be problematic as measurements must necessarily be made through these connections. It is impractical (and unpopular) to cut off a connector from the user's patch cord to make the test as it is often done in laboratory environments. The crosstalk, return loss and other effects of these connections must instead be ignored (cancelled or otherwise suppressed) when measuring the channel. These connections can have a considerable affect on the measurement and mask the true performance of the channel under test. Often the contributions of these connections will cause an otherwise compliant link to fail. Accordingly, it is important that channel performance be measured accurately per the definition of the appropriate standard to ensure its transmission capability. Currently this channel measurement problem is not addressed adequately by any field test equipment.

In current implementations of field test instruments, several methods are employed to make measurements through these necessary but troublesome connections. The first and simplest is to simply accept the additional crosstalk, return loss, etc. of the instrument connections and include them in the accuracy specification of the test instrument. This may result in an inaccurate measurement of channel 100. Instruments that do not correct for the instrument connections are generally classified by the standards body as having "Level I Accuracy" due to errors introduced by measuring through instrument connections with no compensation. Level I Accuracy instruments are generally not considered adequate for testing of new, high performance cabling systems.

A second, seemingly improved method for suppressing the instrument connections is to subtract out the contribution of a "nominal" connection from the measured data. This method requires that the measurement instrument have full knowledge of the magnitude and phase of both the measured signals and connection characteristics. While this method may appear to be a solution, in fact, there can be significant differences between the amount of crosstalk, return loss, and the like contributed by the specific jack and plug comprising the connection. The variability often results in tradeoffs made by each manufacturer and physical issues associated with terminating a plug onto a cable. Plugs from the same manufacturer that appear identical can have significantly different NEXT characteristics. Therefore, it may not be possible to have a priori knowledge of a suitable connection contribution that must be cancelled. That is, subtraction of "nominal" crosstalk from measured data can increase the amount of indicated crosstalk, return loss and the like. Thus, it is unlikely that test equipment utilizing this method of correction, known as fixed vector cancellation, could qualify for better than Level I performance.

Another method that at first consideration seems to be effective for improving response measurements is called "time gating". An example of this technique is disclosed in U.S. Pat. No. 5,698,985, entitled "Cross-Talk Measurement Instrument With Source Indication as a Function of Distance," issued to Bottman and assigned to the Fluke Corporation on Dec. 16, 1997. The channel measurements are performed through and including the channel adapter and user's cord connector and these results are converted to the time domain. A section of the time data corresponding to the location of the instrument connection is then mathematically set to zero (i.e. "time-gated out"), and the modified time data is converted back into the frequency domain for comparison with channel performance limits. This method has the benefit that the contribution of crosstalk, return loss and the like, of the instrument connection may be completely suppressed without having prior knowledge of the connection characteristics of performance.

However, this method suffers from additional shortcomings. For example, one problem with time gating results from the fact that there is limited bandwidth available in the frequency domain, and thus limited time resolution to perform the time gating. In order to minimize other artifacts related to the time gating procedure, the amount of time data that must be zeroed or otherwise modified must necessarily extend well beyond the instrument connection.

A second limitation of the time gating method primarily affects the return loss measurement. Return loss is a measure of the amount of signal reflected by the transmission channel. Reflections at the beginning of the channel have two significant components. One reflection is from "point sources" of returned signal, such as the connector interface. The second reflection is caused by the transition from the impedance of the test environment to the impedance of the cable. Time gating for return loss measurements can lead to significant errors due to ignoring the initial cable impedance mismatch as well ignoring reflections in the first few feet of the cable. These initial sources of return loss can sometimes be a dominant contributor to a "FAIL" return loss indication and preferably should not be suppressed. Time gating results in missing an important portion of the crosstalk or return loss in the user's patch cord. Current field testers that implement some form of time gating typically ignore up to the first 3 to 4 feet of the user patch cable due to bandwidth and sampling considerations. This can be a serious shortcoming since the channel high frequency performance is strongly influenced by the first few feet of the cable. The "dead zone" created by the time gating does not adhere to the true definition of the channel which starts immediately after the plug. Bandwidths in the 10s of GHz are typically required in order to have a suitably short dead zone so as not to impact the measurement. This extremely wide bandwidth requirement is beyond the current state of field test equipment.

SUMMARY OF THE INVENTION

A method of signal correction in accordance with the present invention, may be referred to as an Adaptive Vector Cancellation method (AVC). In an exemplary embodiment of the present invention, with AVC, time domain data for an instrument connection is obtained and an estimate is made of the magnitude, phase, and time position of a signal response such as NEXT or Return Loss associated with the connection. For example, for a channel adapter whose connector is close to the instrument itself, the connection response occurs near time zero. Based on the estimate of the amplitude and time of the connection response, a suitable full-bandwidth frequency response that corresponds to a point source of NEXT or Return Loss is calculated, referred to in a table or determined through other similar means. This calculated connector response is then scaled to an appropriate magnitude, phase and time shifted to the estimated position of the actual connection. The scaled/shifted response is then vectorially combined with the measured sweep data to suitably cancel the connection contribution to NEXT and/or Return Loss. Thus, the amount of NEXT or return loss existing in the user's patch cord is preserved, while the NEXT or return loss due to the instrument connection (which is essentially a "point source") is suitably suppressed. Correction is done in the frequency domain, over the full bandwidth of the measured data.

AVC combines time domain analysis and non-bandwidth-limited application of that analysis in a manner that results in a channel measurement that more closely meets or exceeds industry requirements for measurement accuracy. Current field test instruments use time domain techniques to identify and time-gate out sources of NEXT and return loss in, but they do not use this information to estimate the magnitude, phase and position of these sources so they can be cancelled. Using AVC for channel measurement processes the time data to estimate the magnitude, phase and exact location of the channel adapter NEXT or return loss and then subtracts the idealized frequency domain model of those sources at the correct position, magnitude and phase.

Further, AVC may be suitably applied to measurements where the connection to the cabling system is removed by an extension of a length of cable or other media. In such a system, the crosstalk and return loss influence of that extension by conventional means, then the crosstalk and return loss contribution of the connector interface (e.g. to the channel) at the end of the extension may be suitably removed.

The development of a field test instrument that can make accurate channel measurements that comply with standards is beneficial to the data communication industry. Up to the time of this invention there has been no method for making field channel measurements that are accurate and compliant with the requirements of the industry standards.

BRIEF DESCRIPTION OF THE DRAWINGS

Additional aspects of the present invention will become evident upon reviewing the non-limiting embodiments described in the specification and the claims taken in conjunction with the accompanying figures, wherein like numerals designate like elements, and:

DETAILED DESCRIPTION OF EXEMPLARY EMBODIMENTS

Figure 1:
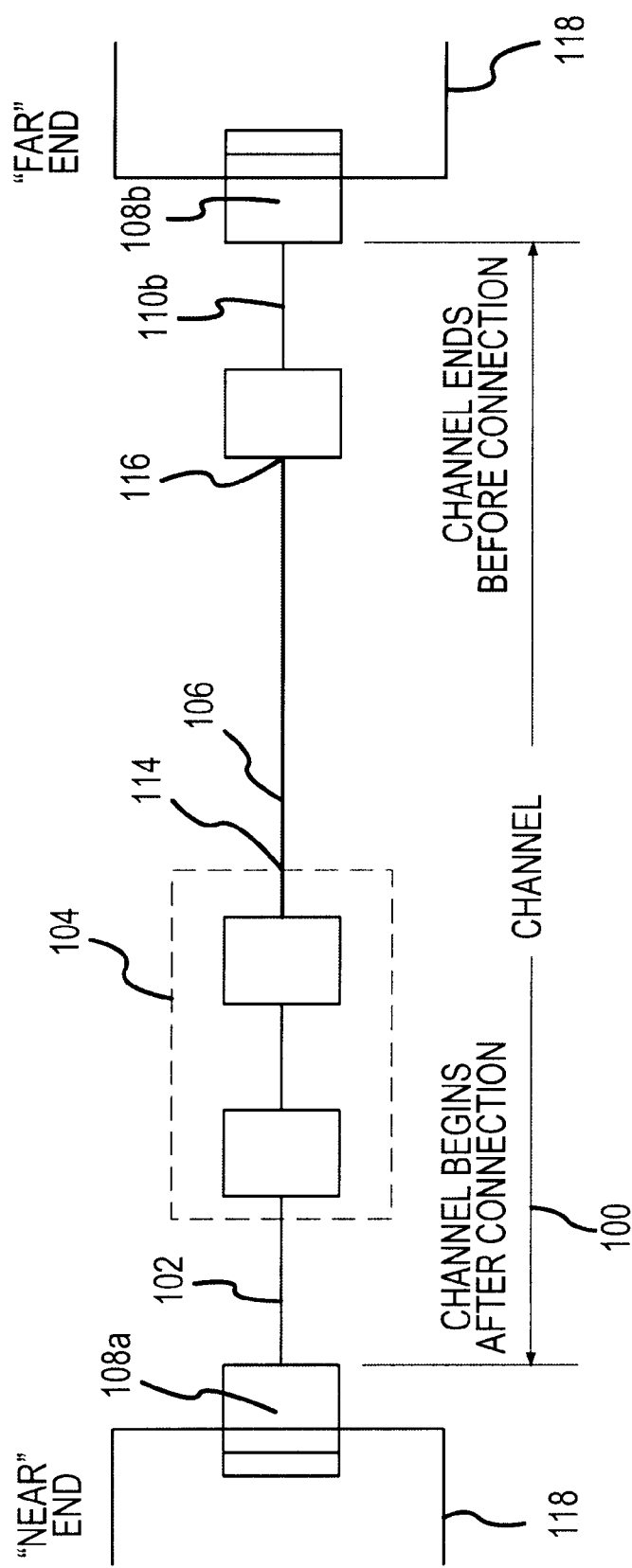
FIG. 1 is a typical channel and field test configuration.
Figure 2:
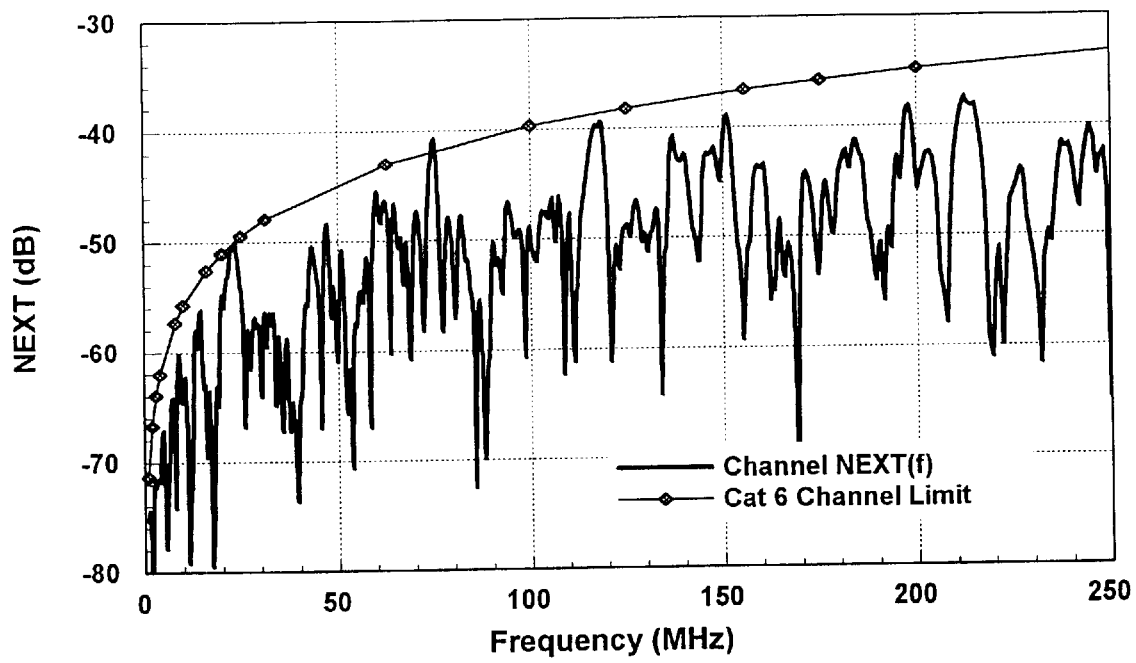
FIG. 2 is a graph showing NEXT vs. Frequency for a Failing Category 6 channel.

The following descriptions are of exemplary embodiments only, and are not intended to limit the scope, applicability, or configuration of the invention in any way. Rather, the following description provides convenient illustrations for implementing a preferred embodiment of the invention. Various changes may be made in the function and arrangement of the elements described in the preferred embodiments without departing from the spirit and scope of the invention as set forth in the appended claims. For example, while the following description is directed largely to cancellation of connector response, likewise, it should be appreciated that the exemplary methods described herein also apply to cancellation of responses in other portions of cabling links.

The present invention relates generally to a method to estimate the idealized time-domain performance of a test equipment interface and to apply the estimate to frequency domain data measured through the interface with the purpose of removing the influence of that interface on the measurement. It is generally recognized that LAN connecting hardware components are electrically short, and may have NEXT and Return Loss characteristics that can be considered as point NEXT and reflection sources. Furthermore, it is generally recognized that ideal characteristics of these point sources can be described by simple frequency domain equations once their magnitude, phase (or polarity) and time position have been determined using various signal processing techniques such as Inverse Fourier transformations and other suitable mathematical techniques. In accordance with various aspects of the present invention, the frequency domain equations may then be evaluated at actual measurement frequencies, and the effect of those point sources (and hence the connection) removed from the measurement.

A method of signal correction in accordance with an exemplary embodiment of the present invention, referred to generally herein as Adaptive Vector Cancellation (AVC) 10, uses time domain data for an instrument connection to estimate the magnitude, phase, and time position of a signal response such as NEXT or Return Loss associated with the connection. For example, for a channel adapter whose connector is close to the instrument itself, the connection response occurs at near time zero. Based on estimates of the amplitude and time of the connection response, a suitable full-bandwidth frequency response that corresponds to a point source of NEXT or Return Loss is calculated, referred to in a table or determined through other similar means. This calculated connector response is then scaled to an appropriate magnitude and phase and time shifted to the estimated position of the actual connection. The scaled/shifted response is then vectorially combined with the measured sweep data to suitably cancel the connection contribution to NEXT and/or Return Loss. Thus, the amount of NEXT or return loss existing in the user's patch cord is preserved, while the NEXT or return loss due to the instrument connection (which is essentially a "point source") is suitably suppressed. Correction is done in the frequency domain, over the full bandwidth of the measured data.

Figure 3:
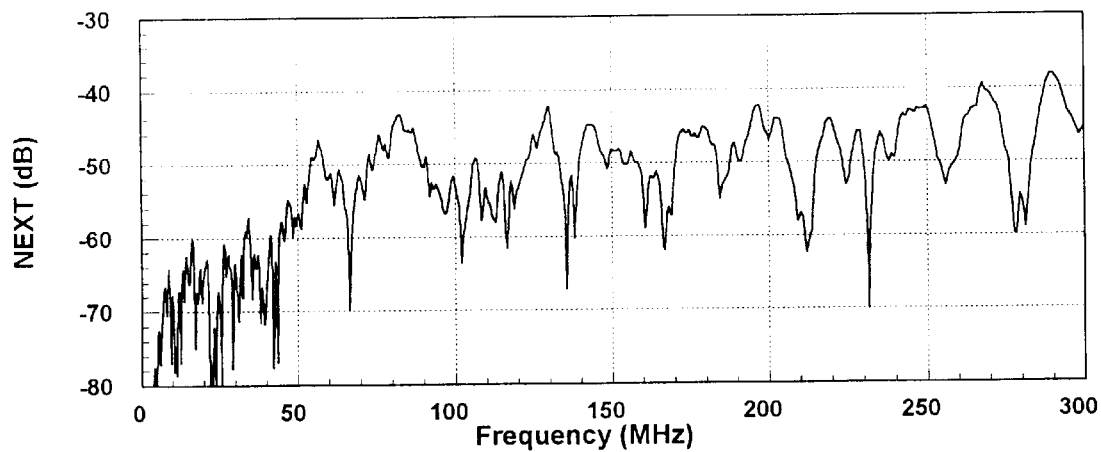
FIG. 3 is a graph showing uncorrected NEXT measurement of a channel vs. Frequency.
Figure 4:
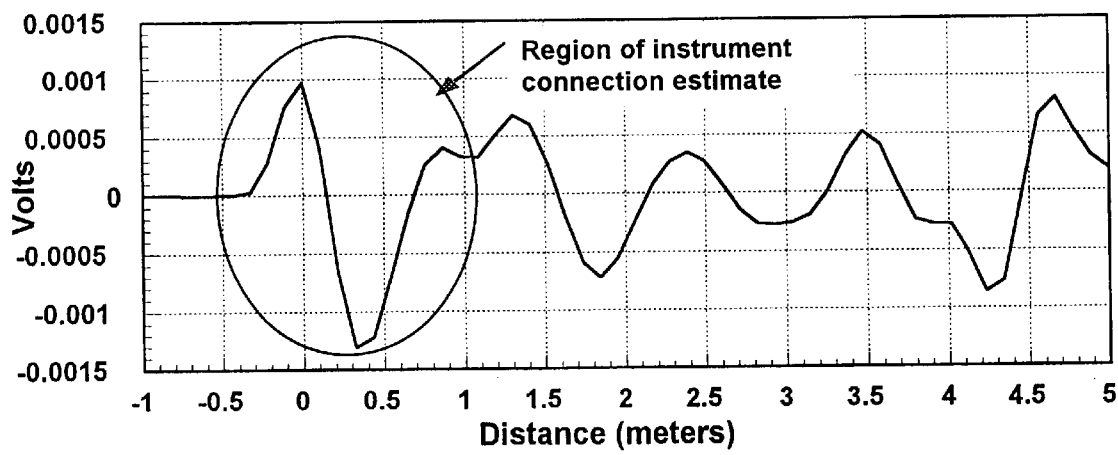
FIG. 4 is a graph showing uncorrected NEXT measurement of a channel vs. Time.
Figure 5:
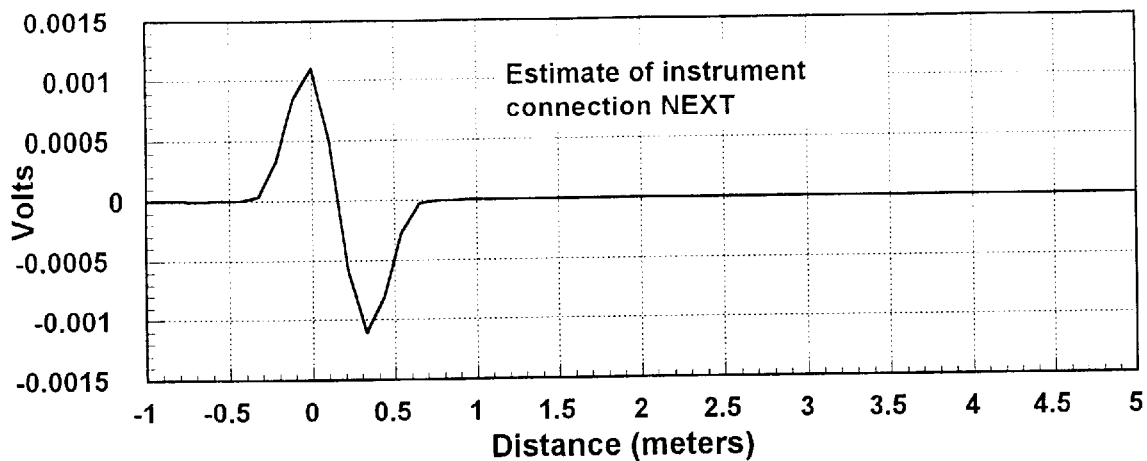
FIG. 5 is a graph showing an AVC estimate of the Field Test Instrument Connection NEXT vs. Time.
Figure 6:
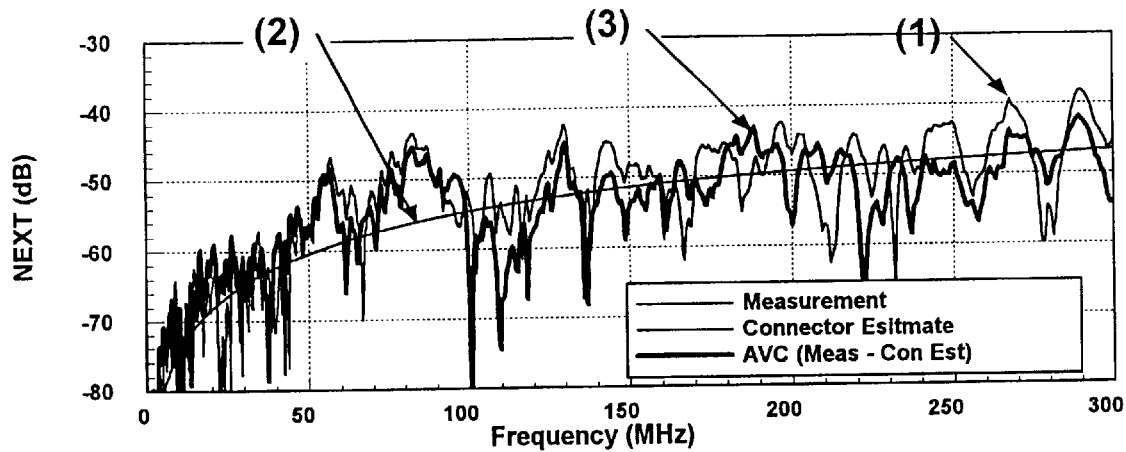
FIG. 6 is a graph showing the frequency domain uncorrected NEXT, instrument connection NEXT estimate and corrected channel NEXT responses.
Figure 7:
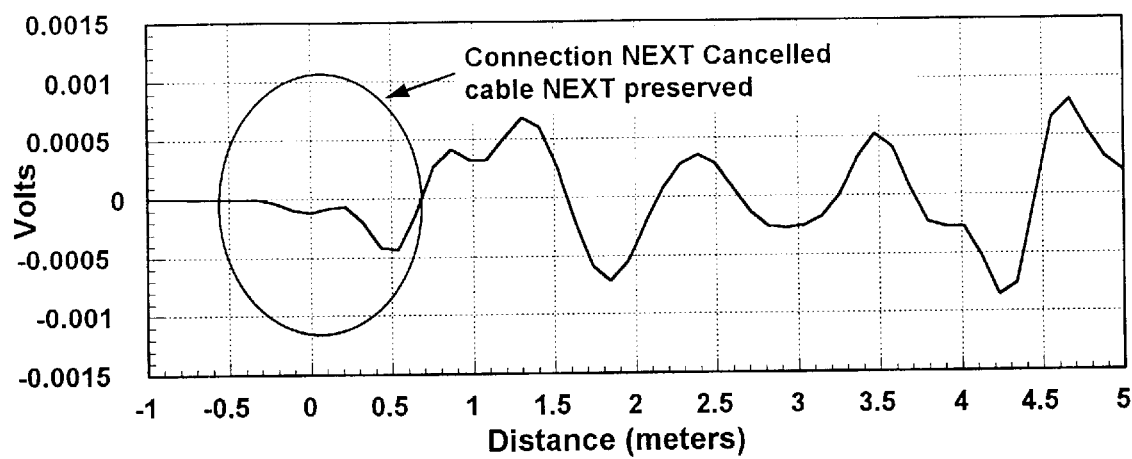
FIG. 7 is a graph showing an AVC processed NEXT response vs. Time.

A non-limiting example of an AVC process 10 in accordance with various aspects of the present invention works for channel NEXT measurements is illustratively provided in FIGS. 3–7. FIG. 3 is a frequency domain plot of an unprocessed NEXT measurement of a channel. This data includes the channel adapter and user patch cord connectors' NEXT contributions. FIG. 4 is a time domain representation of the uncorrected NEXT data. The instrument connection NEXT is suitably separated and identified as the response at close to zero distance. FIG. 5 shows a time domain plot of the estimate and position of the connection NEXT made by an AVC processing algorithm. The full bandwidth frequency domain equivalent of this estimate is then used to suitably cancel the connection contribution from the frequency domain measurement. FIG. 6 is a frequency domain graph showing (1) the uncorrected, (2) the connector cancellation estimate and finally (3) the processed connector cancelled data that is the channel result. Notably, the connector NEXT is a significant contributor to this measurement and, if left uncancelled, could be a large error contribution to the measurement. Finally, FIG. 7 is a time domain plot of the of an AVC processed data showing that the connector NEXT contribution is canceled while preserving the NEXT in the cable in the immediate region beyond the connection. Thus, AVC 10 produces suitably accurate channel measurements that are in compliance with the measurement requirements of the industry standards. Similarly, the additional return loss from an instrument connection may be estimated, calculated, and removed, leaving only the return loss of the channel.

Accordingly, AVC 10 combines time domain analysis and non-band-width-limited application of that analysis in a manner that results in a channel measurement that exceeds industry requirements for measurement accuracy. AVC 10 for channel measurements processes the time data to estimate the magnitude, phase and exact location of the channel adapter NEXT or return loss and then subtracts the idealized frequency domain model of those sources at the correct position, magnitude and phase.

Figure 8:
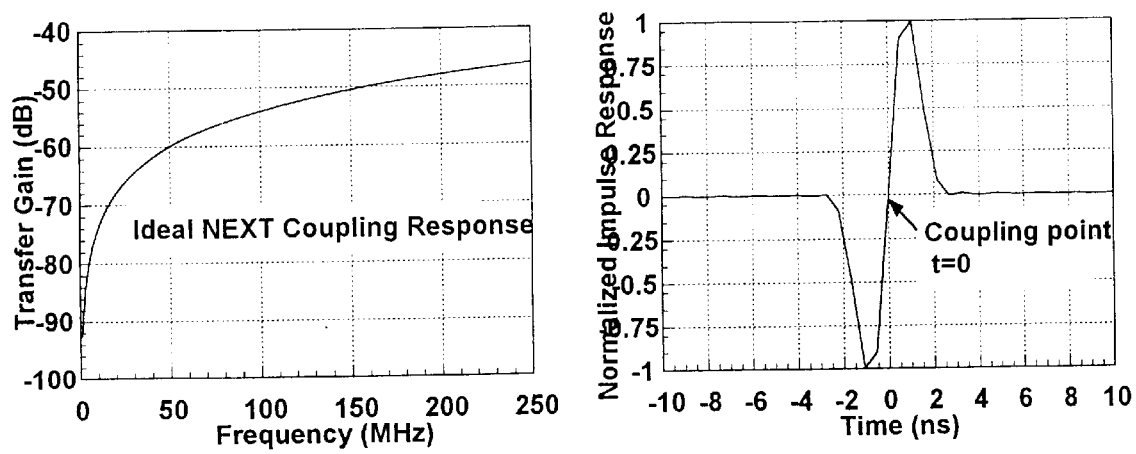
FIG. 8 is a diagram showing the frequency and time response of an ideal point source of NEXT.
Figure 9:
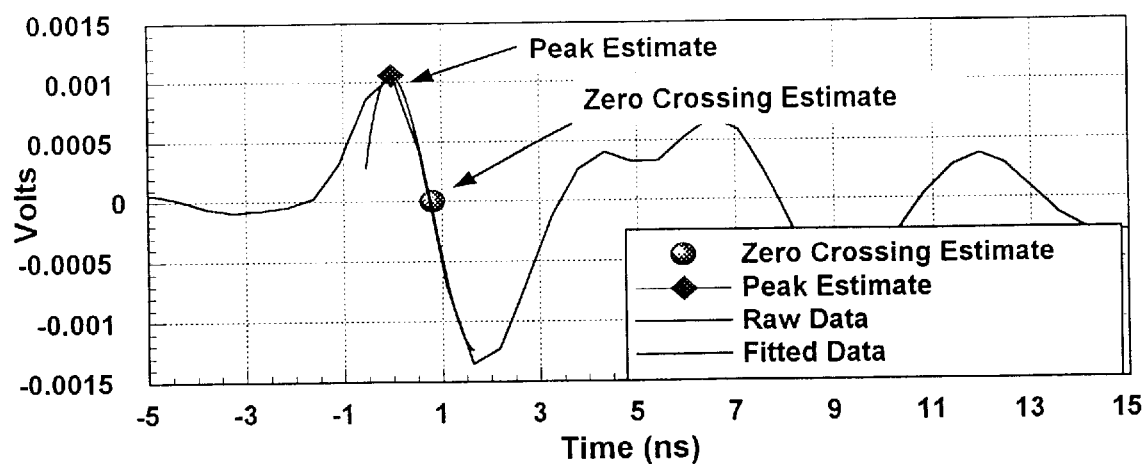
FIG. 9 is a graph showing the connector response estimation process.

For example, in accordance with an exemplary embodiment of the present invention, FIG. 8 illustrates a transformation of a typical connection NEXT response to the time domain. The time-domain response of the connection closely resembles a differentiated parabolic function. Knowing the approximate location and shape of a connector response allows the time response of the connector to be located and identified. Once the connector response is located, several points are chosen on the time domain waveform, and using standard mathematical techniques, the coefficients for a suitable polynomial that most closely fits the curve are selected. FIG. 9 is exemplary of chosen points and a curve that best fits those points. Using the calculated coefficients, a polynomial equation is evaluated for a zero crossing center (zero point of its second derivative), the magnitude of its peaks (zero points of its first derivative), and the polarity of those peaks. An evaluated magnitude and center point suitably define an estimation of a cancellation curve. The polarity of the cancellation estimate is suitably determined by a first peak in negative time, i.e., time before the zero crossing. In this example, the estimate for the cancellation curve is positive.

Thus, in accordance with one aspect of the present invention, suitable mathematical curve fitting techniques allow estimation of the zero crossing and peak amplitude of the connector response to be calculated to a substantially high degree of resolution. By using AVC 10 the estimation of the connection position is not directly limited by system bandwidth or sampling resolution. This allows the estimated cancellation curve to be suitably positioned where necessary to improve cancellation of the actual connector response.

To form a prototype NEXT source used to establish the cancellation response, a mathematical model of an ideal NEXT source is constructed such that its representative response in the time domain has a certain reference amplitude. The frequency domain representation of the prototype is then scaled to that of a "best fit" curve such as that illustrated above, and its phase is adjusted to be positive or negative (+ or −90 degrees) depending on the polarity of that response. The frequency data is then phase delayed (time shifted) to be coincident with the zero-crossing point of the best fit curve.

Figure 10:
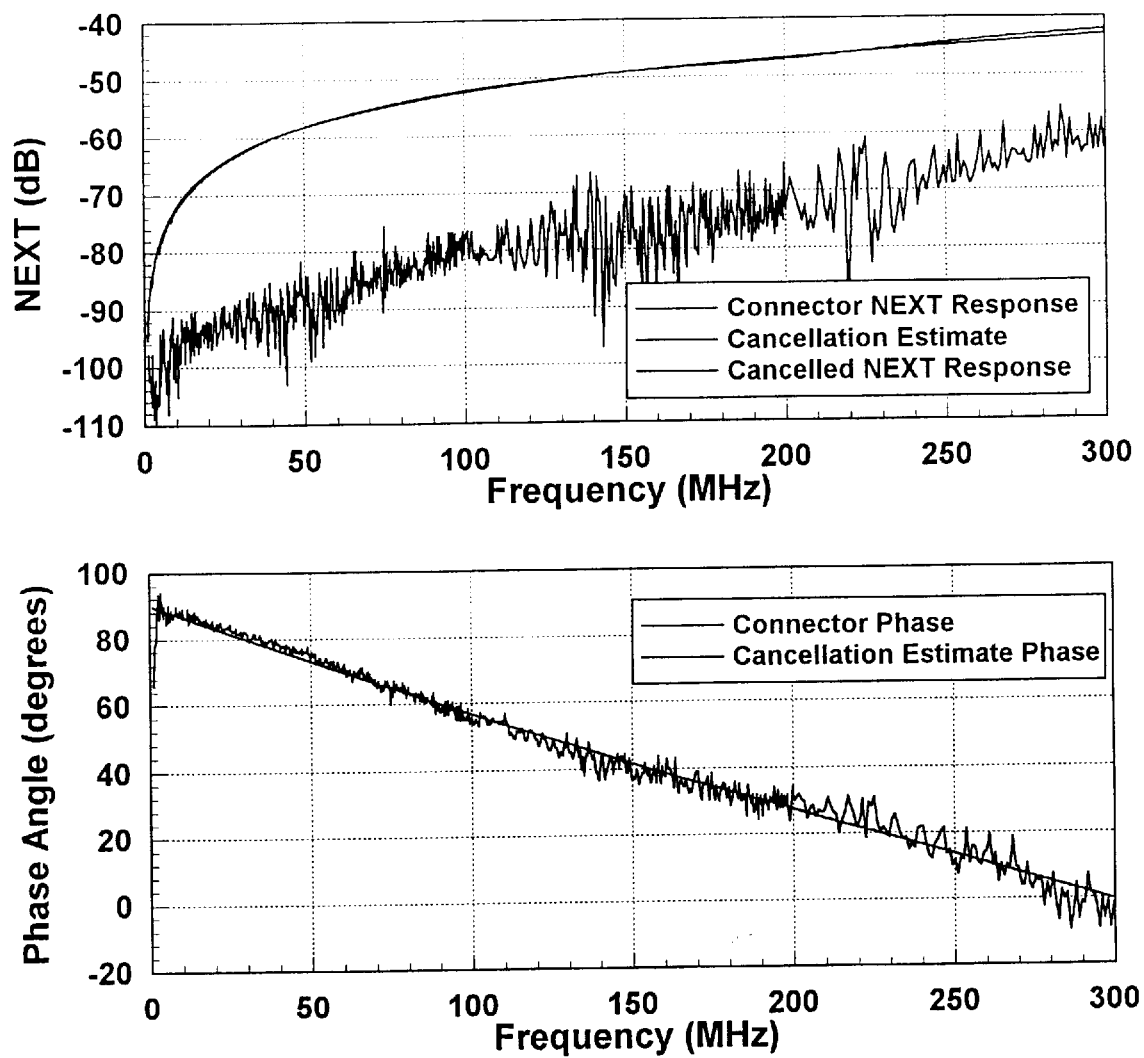
FIG. 10 is a graph showing the comparison between a measured connector and AVC estimated response vs. Frequency.

FIG. 10 shows a frequency domain magnitude and phase plot of an actual measured example connector and of the scaled, time-shifted prototype NEXT source estimated by the above process used to cancel the connector NEXT. Included on the magnitude graph is a residual that remains after the connector NEXT cancellation process. This residual curve shows the degree cancellation of the connector NEXT that is achieved. In accordance with various aspects of AVC 10, suppression of the connector response is typically in excess of about 20 dB and is achieved across substantially the entire frequency range. The initial phase (either + or −90 degrees) and magnitude estimate of the cancellation curve is suitably made from the direction and amplitude of the fitted curve. The time shifting of the prototype curve such that it aligns with the estimated position of the actual connection suitably results in a slope of the phase with frequency. In this example, AVC 10 suitably provides an estimate of substantially all parameters. This is evidenced by how closely the cancellation curve matches the measured connection response. Such an estimate of both magnitude and position of the connector suitably achieves the desired cancellation. Additionally, in accordance with another aspect of the present invention, the process can be applied iteratively any number of times (N times) to further suppress additional unwanted connection response(s).

According to an alternative embodiment of the present invention, AVC 10 can be used to estimate the Return Loss of an instrument connection and remove Return Loss effects. Generally, in the case of Return Loss, characteristic impedance differences between the measurement environment reference impedance and the user patch cable are suitably considered along with the connector reflection characteristics. This involves suitably separating out the contribution of the cable characteristic impedance (generally a unipolar impulse response in the time domain) and the connection's contribution (a bipolar time response). In an exemplary embodiment, the prototype curve, which is suitably scaled, shifted, and ultimately subtracted from the cascaded measurement, is suitably fit to the time response after first ignoring the component due to characteristic impedance changes.

Preferably, the unipolar component of the response is identified by suitably integrating over a short window at the beginning of the time data to eliminate any bipolar component. A suitable curve is then fit to the integrated response to estimate the unipolar component. This estimate of the unipolar component is then suitably mathematically removed from the original data set and processed as described previously with respect to NEXT response to allow estimation of the bipolar component. Maintaining the reflection of any impedance mismatch from the user patch cord is important to performing a compliant and accurate channel return loss measurement.

Figure 11:
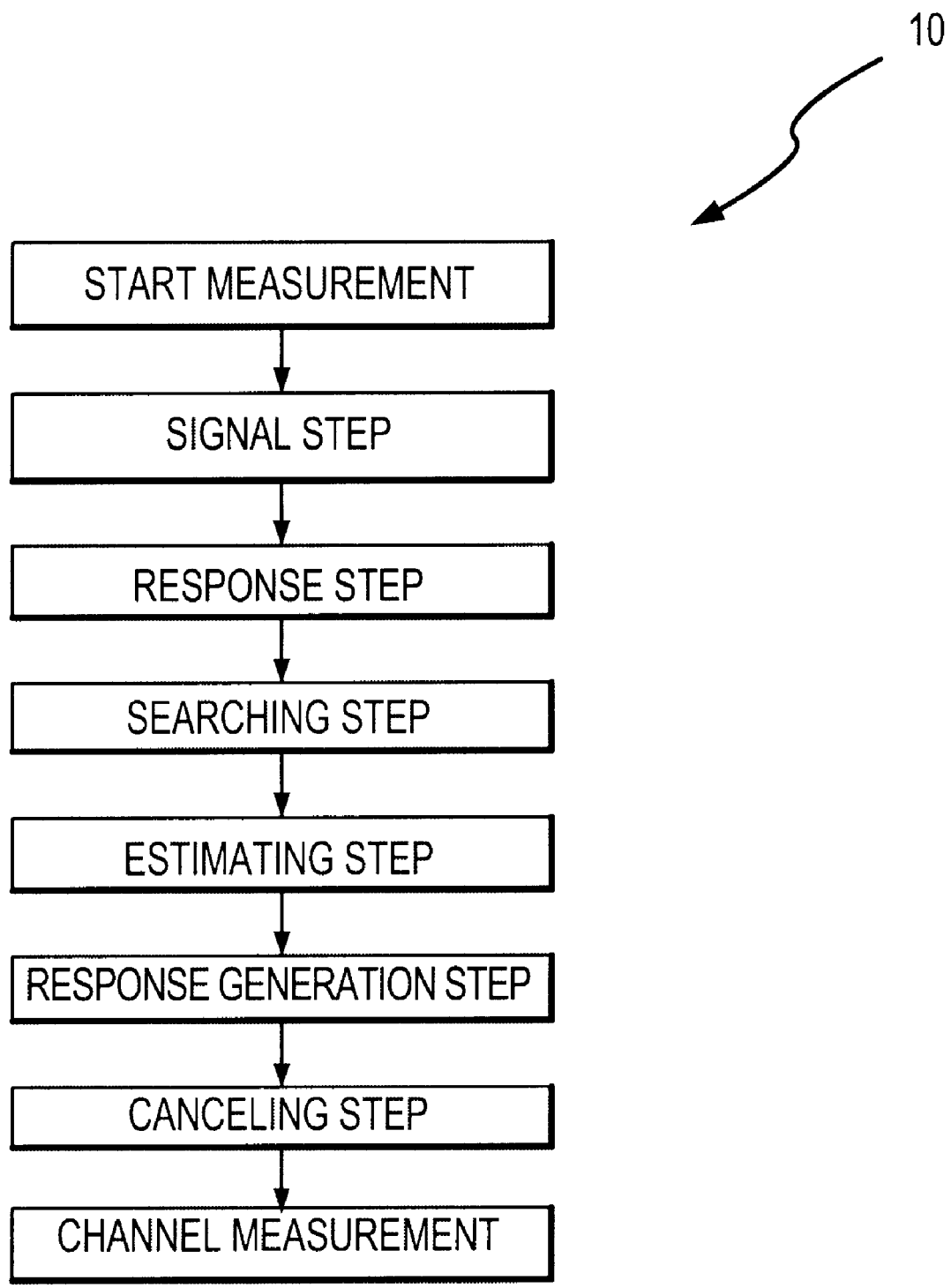
FIG. 11 is an exemplary embodiment of an AVC algorithm process.

With reference now to FIG. 11, an exemplary method for implementing AVC 10 is illustrated. After starting the measurement, a signal step 310 comprises sending a test signal through a channel. Test signal step 310 is then used in a response step 320 determines a response corresponding to said test signal. In accordance with various aspects of the present invention, response step 320 may be determined in any conventional domain, such as, for example in the frequency domain, time domain or the like. A searching step 330 then searches the response for a connector response signature and in an estimating step 340, an amplitude and a location of the connector response signature is determined. Next, an ideal frequency response generation step 350 determines an ideal frequency response corresponding to the connector response signature at the estimated amplitude and location. Finally, a canceling step 360 cancels the connector response signature with the ideal frequency response, thus removing the various NEXT, Return Loss and the like contributions of the connector interface.

Figure 12:
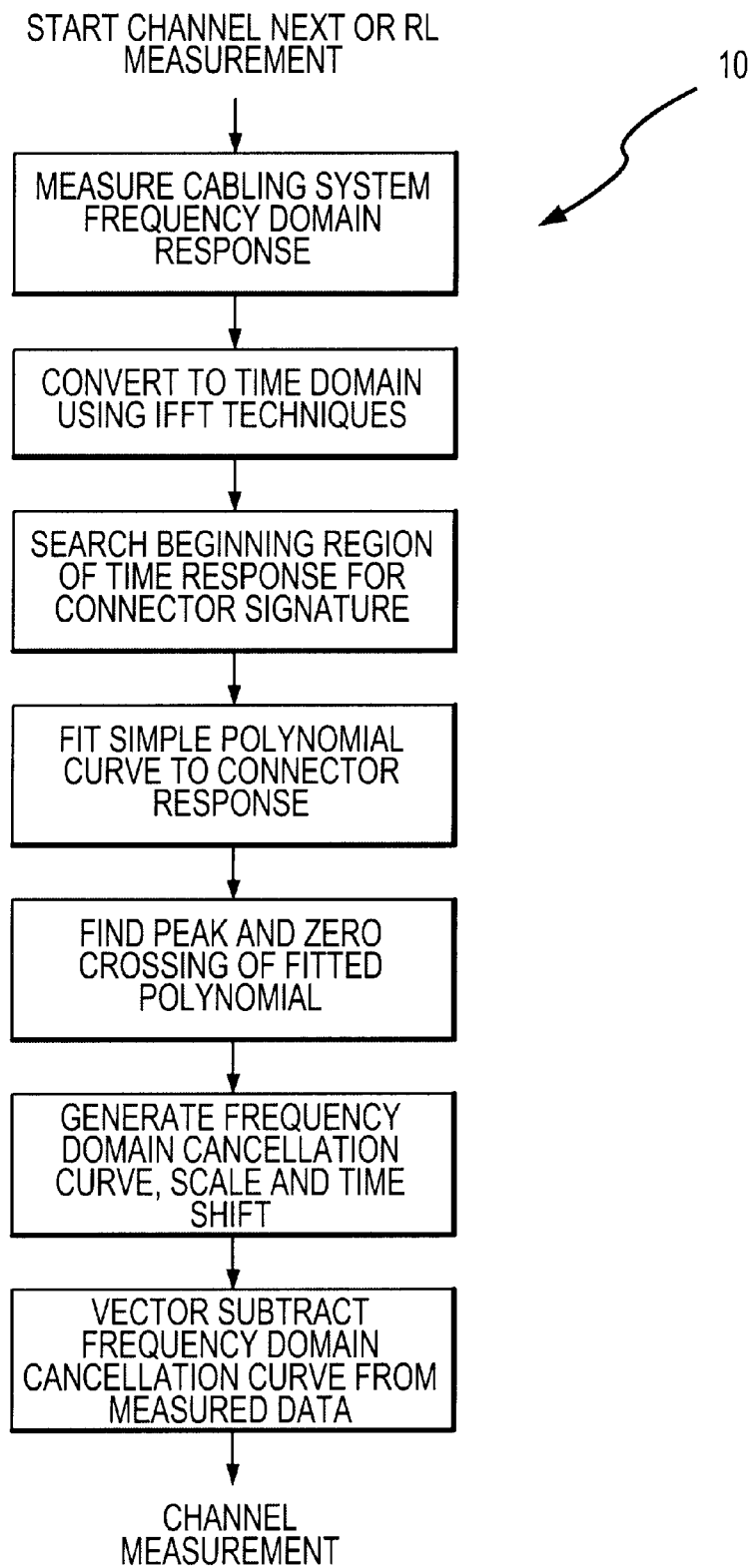
FIG. 12 is a flow chart of an alternative embodiment of an AVC algorithm process.

An alternative process for implementing AVC 10 is shown in the flow chart of FIG. 12. This flow chart is presented assuming the test instrument makes measurements in the frequency domain. However, one skilled in the art will recognize a similar process can be performed if the instrument measurements are made in the time domain. The measurement and conversion steps are suitably modified to accommodate that the data is gathered in the time domain.

Figure 13:
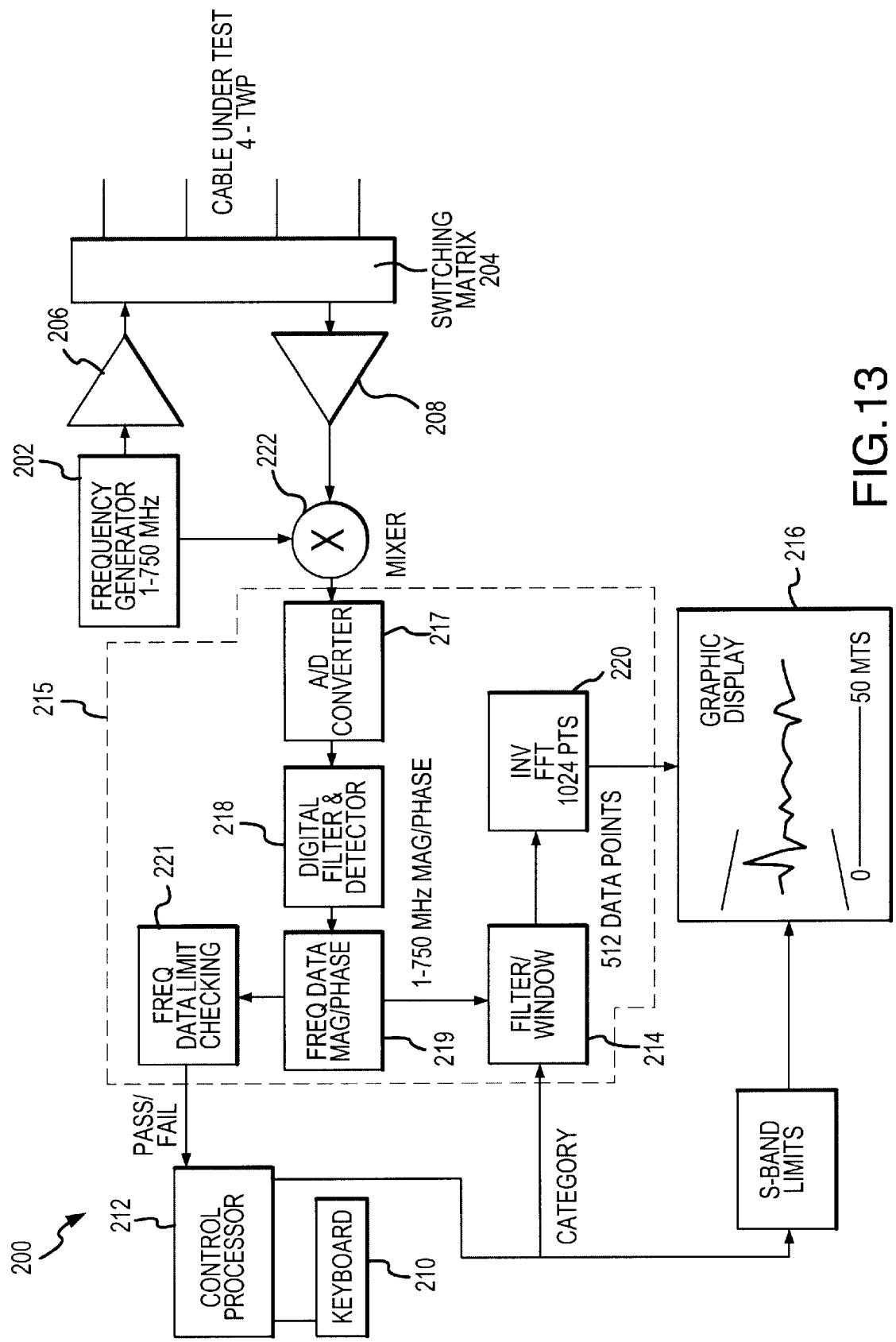
FIG. 13 is a block diagram of a frequency domain cable field certification tool capable of implementing an AVC processing Algorithm.

A simplified block diagram of a preferred embodiment of a cable field certification instrument capable of implementing AVC channel measurements is shown in FIG. 13. The measurement system is based on a swept frequency domain system that detects both magnitude and phase of the received signals. Full vector frequency domain data (i.e. both magnitude and phase data) are suitably used to allow time information to be extracted by, for example, a Fourier transform signal processing technique. The frequency domain measurement system is preferred because it is a domain where ideal characteristics of the connection can be cancelled with little to no bandwidth limitations.

An exemplary measurement instrument in accordance with the present invention consists of a frequency generator 202 of about 1–750 MHz, a switch matrix 204 to connect the transmitter 206 and receiver 208 to the desired pairs, and signal processing circuits 215 for detection and limit checking of the received data. The receiver function is preferably implemented through narrow band heterodyne techniques that allow tracking of the transmitted signal. The received signal is suitably converted to digital format and processed through, for example, a Discrete Fourier Transform filter to detect the magnitude and phase of the received signal. The detected magnitude of the received signal is suitably compared to defined test criteria at each frequency and a pass or fail indication is generated.

Preferably signal processing circuits 215 of the present exemplary embodiment consist of a suitable analog to digital converter 217, a digital filter and detector 218 which processes one or more digitally converted samples of the intermediate frequency output of the mixer 222 into a complex i.e. real and imaginary value for each frequency of test. These complex valued signals are mathematically converted into magnitude and phase using a suitable rectangular-to-polar transformation mechanism 219. These frequency domain data results may also be processed and stored in internal or external memory for further certification tests. The magnitude values are further suitably converted into decibel values and compared frequency-by-frequency to the suitable frequency domain limits 221, and a pass or fail indication is suitably generated and sent to the control processor 212. The complex valued signals from digital filter and detector 218 are also routed to a suitable filter/windowing function 214 in order to provide a desired level of anti-aliasing and effective impulse shaping, described in more detail below. Filter/window 214 applies a suitable scaling coefficient to each complex data value (sample) according to the frequency at which it was acquired. These windowed complex signals for each frequency are taken together and applied to an inverse Fourier Transform mechanism 220 (for example, a Cooley-Tukey Fast Fourier Transform or the like), to suitably convert the frequency domain signal into a time domain representation.

According to the various aspects of the present invention, control processor 212 initiates tests in response to user commands through an input device 210 such as, for example, a keyboard, keypad, push buttons or the like. The test results are suitably stored in a standard control processor memory. The native frequency domain data results can be processed and stored for any certification tests. Channel specification limits may be defined as a function of frequency and reports may be used to show at what frequency failures occurred. In accordance with an alternative aspect of the present invention, a similar measurement and processing system may be used in the remote scanner unit to allow the same measurements to be performed at the far end of the channel.

In accordance with one aspect of the present invention, the user can select and initiate channel measurements via keyboard 210 commands. These commands suitably initiate a NEXT or Return Loss measurement on the desired pairs up to the full frequency range of about 1–750 MHz. Measurement to the highest possible frequency is desired to provide good time resolution to aid AVC 10 estimation processes. The higher the measured frequency, the better the time resolution of the processed data, and the better the estimate of the sources of NEXT and return o loss at the instrument connection to the channel. The frequency data may then be processed and detected in normal fashion and passed through a frequency filter and window prior to the Inverse Fourier Transform operation. These measurements may be performed at one or both ends of the link in the main or remote unit to allow tests to be performed on either end.

The filtered data is then suitably processed via a 1024 point inverse FFT algorithm to convert it to the time domain, where it is then used to estimate the instrument connection parameters. These parameters are then used to modify a retrieved or suitably calculated prototype NEXT or return loss frequency domain response curve to remove the corresponding connection NEXT or return loss.

The combination of adaptive time domain estimation of connection parameters and the perfect mathematical removal of a scaled, phase-delayed matching prototype of those parameters from a measurement provides a significant enhancement to the field measurement of LAN cabling channels. The compromise of additional error due to making no correction or of "over-correcting" by time gating does not have to be made. With the higher performance cabling systems (e.g., Category 6 and Category 7) being installed, a correct measurement with minimal uncertainty serves the needs of both the installer and cable system purchaser alike.

Thus, while the principles of the invention have been described in illustrative embodiments, many combinations and modifications of the above-described structures, arrangements, proportions, the elements, materials and components, used in the practice of the invention, in addition to those not specifically described, may be varied and particularly adapted for a specific environment and operating requirement without departing from those principles. For example, other embodiments are possible to implement an adaptive vector correction system. It is possible to make NEXT and Return Loss measurements via a time domain pulse transmission approach, and apply the estimation directly to the time domain data. Likewise, other measurements such as ELFEXT, Insertion Loss, and the like, may be measured and suitably canceled.

We claim:

1. A method for improving performance characteristic testing, comprising the steps of:

(a) sending a test signal through a channel;

(b) obtaining a time domain impulse response corresponding to said test signal;

(c) searching said time domain impulse response for a connector response signature;

(d) estimating an amplitude and a location of said connector response signature;

(e) generating an ideal frequency response corresponding to said connector response signature at said amplitude and said location; and (f) canceling said connector response signature with said ideal frequency.

2. The method of claim 1, further comprising the steps of:

(g) searching said time domain response for an $N^{th}$ connector response 3 signature; and (h) estimating an $N^{th}$ amplitude and an $N^{th}$ location of said $N^{th}$ connector response signature;

(i) generating an $N^{th}$ ideal frequency response corresponding to said $N^{th}$ connector response signature at said $N^{th}$ amplitude and said $N^{th}$ location; and (j) canceling said $N^{th}$ connector response signature with said $N^{th}$ ideal frequency response.

3. The method of claim 1, wherein said connector response signature is a NEXT response.

4. The method of claim 1, wherein said connector response signature is a Return Loss response.

5. The method of claim 1, wherein said estimating step further comprises the step of determining a peak response and a zero crossing point.

6. The method of claim 1, wherein said generating step comprises determining a polynomial curve corresponding to said connector response signature.

7. The method of claim 1, wherein said searching step is performed about a predetermined range of time or distance.

8. The method of claim 1, wherein said searching step is performed near zero time or distance.

9. A method for removing an undesirable performance characteristic measured by cable field testers, comprising the steps of:

(a) sending a test signal through a channel;

(b) obtaining an impulse frequency response corresponding to said test signal;

(c) converting said impulse frequency response to a time domain response;

(d) searching said time domain response for a connector response signature;

(e) estimating an amplitude and a location of said connector response signature;

(f) generating an ideal frequency response corresponding to said connector response signature at said amplitude and said location; and (g) canceling said connector response signature with said ideal frequency response.

10. The method of claim 9, further comprising the steps of:

(h) searching said time domain response for an $N^{th}$ connector response signature; and (i) estimating an $N^{th}$ amplitude and an $N^{th}$ location of said $N^{th}$ connector response signature;

(j) generating an $N^{th}$ ideal frequency response corresponding to said $N^{th}$ connector response signature at said $N^{th}$ amplitude and said $N^{th}$ location; and (k) canceling said $N^{th}$ connector response signature with said $N^{th}$ ideal frequency response.

11. The method of claim 9, wherein said connector response signature is a NEXT response.

12. The method of claim 9, wherein said connector response signature is a Return Loss response.

13. The method of claim 9, wherein said searching step is performed about a predetermined range of time or distance.

14. The method of claim 9, wherein said searching step is performed near zero time or distance.

15. The method of claim 9, wherein said estimating step further comprises the step of determining a peak response and a zero crossing point.

16. The method of claim 9, wherein said generating step comprises determining a polynomial curve corresponding to said connector response signature.

17. A method for removing an undesirable performance characteristic measured by cable field testers, comprising the steps of:

(a) sending a test signal through a channel;

(b) obtaining a time domain impulse response corresponding to said test signal;

(c) searching said time domain impulse response for a connector response signature;

(d) estimating an amplitude and a location of said connector response signature;

(e) determining a peak response and a zero crossing point of said connector response signature;

(f) generating a polynomial curve of an ideal frequency response corresponding to said connector response signature; and (g) canceling said connector response signature with said polynomial curve.

18. The method of claim 17, further comprising the steps of:

(h) searching said time domain response for a second connector response signature; and (i) estimating a second amplitude and a second location of said second connector response signature;

(j) determining a second peak response and a second zero crossing point of said second connector response signature;

(i) generating a second polynomial curve of a second ideal frequency response corresponding to said second connector response signature; and (j) canceling said second connector response signature with said second polynomial curve.

19. The method of claim 17, wherein said connector response signature is a NEXT response.

20. The method of claim 17, wherein said connector response signature is a Return Loss response.

21. The method of claim 17, wherein said searching step is performed about a predetermined range of time or distance.

22. The method of claim 17, wherein said searching step is performed near zero time or distance.

* * * * *